US010527661B2

(12) United States Patent
Leggate et al.

(10) Patent No.: US 10,527,661 B2
(45) Date of Patent: Jan. 7, 2020

(54) CALCULATING A LOAD RESISTANCE

(71) Applicant: Rockwell Automation Technologies, Inc., Mayfield Heights, OH (US)

(72) Inventors: David Leggate, New Berlin, WI (US); Russel J. Kerkman, Milwaukee, WI (US); Brian J. Seibel, Grafton, WI (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 165 days.

(21) Appl. No.: 15/891,272

(22) Filed: Feb. 7, 2018

(65) Prior Publication Data
US 2019/0242934 A1   Aug. 8, 2019

(51) Int. Cl.
*G01R 27/08* (2006.01)
*H03K 7/08* (2006.01)
*G06F 1/025* (2006.01)
*H02M 7/5387* (2007.01)
*G01R 21/127* (2006.01)

(52) U.S. Cl.
CPC ............ *G01R 27/08* (2013.01); *G06F 1/025* (2013.01); *H02M 7/53873* (2013.01); *H03K 7/08* (2013.01); *G01R 21/127* (2013.01)

(58) Field of Classification Search
CPC ........ G01R 27/00; G01R 27/02; G01R 27/08; G01R 29/00; G01R 29/02; G01R 29/023; G01R 21/00; G01R 21/127; G01R 11/40; G06F 1/00; G06F 1/02; G06F 1/025; H03K 7/00; H03K 7/08; H02M 7/537; H02M 7/53871; H02M 7/53873

USPC ............ 324/600, 649, 691, 710, 720, 76.11, 324/76.79, 107; 375/238
See application file for complete search history.

(56) References Cited

U.S. PATENT DOCUMENTS

| 5,570,259 A * | 10/1996 | Allmeier ................ G01R 15/09 361/115 |
| 5,646,499 A * | 7/1997 | Doyama ................. H02P 23/08 318/801 |
| 9,614,531 B1 * | 4/2017 | Shibasaki .......... H03K 19/0005 |
| 2006/0122713 A1 * | 6/2006 | Miller ................ B60G 17/0185 700/21 |
| 2012/0032517 A1 * | 2/2012 | Ido ...................... H02M 3/3376 307/77 |
| 2012/0254641 A1 * | 10/2012 | Rotem ..................... G06F 1/28 713/320 |
| 2016/0164311 A1 * | 6/2016 | Nagata .................. H02J 7/0072 320/134 |

* cited by examiner

*Primary Examiner* — Hoai-An D. Nguyen
(74) *Attorney, Agent, or Firm* — Kunzler Bean & Adamson

(57) ABSTRACT

For calculating load resistance, a pulse generation module drives a pulse width modulation (PWM) inverter in response to a control voltage. The PWM inverter includes a U phase pole, a V phase pole, and a W phase pole. Each U, V, and W phase pole includes an upper pole device and a lower pole device. The PWM inverter turns off the U phase pole, turns on the W upper pole device, turns off the W lower pole device, and applies the control voltage to the V upper pole device and the V lower pole device. A forward drop correction module corrects the control voltage based on a feedforward compensation voltage determined from a forward voltage drop. A load resistance module calculates a load resistance for a load based on an average control voltage, an average bus voltage, and an average load feedback current.

20 Claims, 14 Drawing Sheets

450

| Timer 451 |
| Time 453 |
| Delta Time 467 |
| Interval Data 455 |
| Measurement Time Interval 457 |
| Bus Voltage Data 459 |
| Control Voltage Data 461 |
| Regulator Signal Data 463 |
| Load Feedback Current Data 465 |
| Load Resistance Data 469 |

CALCULATING A LOAD RESISTANCE

BACKGROUND INFORMATION

The subject matter disclosed herein relates to calculating a load resistance.

BRIEF DESCRIPTION

An apparatus for calculating load resistance is disclosed. A pulse generation module drives a pulse width modulation (PWM) inverter in response to a control voltage. The PWM inverter includes a U phase pole, a V phase pole, and a W phase pole. Each U, V, and W phase pole includes an upper pole device and a lower pole device. The PWM inverter turns off the U phase pole, turns on the W upper pole device, turns off the W lower pole device, and applies the control voltage to the V upper pole device and the V lower pole device. A forward drop correction module corrects the control voltage based on a feedforward compensation voltage determined from a forward voltage drop. A load resistance module calculates a load resistance for a load based on an average control voltage, an average bus voltage, and an average load feedback current.

A method for calculating load resistance is disclosed. The method generates inverter drive voltages with a PWM inverter in response to a control voltage. The PWM inverter includes a U phase pole, a V phase pole, and a W phase pole. Each U, V, and W phase pole includes an upper pole device and a lower pole device. The PWM inverter turns off the U phase pole, turns on the W upper pole device, turns off the W lower pole device, and applies the control voltage to the V upper pole device and the V lower pole device. The method further corrects the control voltage based on a feedforward compensation voltage determined from a forward voltage drop. The method calculates a load resistance for a load based on an average control voltage, an average bus voltage, and an average load feedback current.

A system for calculating a load resistance is also disclosed. The system includes a load, a pulse generation module, a forward drop correction module, and a load resistance module. The pulse generation module drives a PWM inverter in response to a control voltage. The PWM inverter includes a U phase pole, a V phase pole, and a W phase pole. Each U, V, and W phase pole includes an upper pole device and a lower pole device. The PWM inverter turns off the U phase pole, turns on the W upper pole device, turns off the W lower pole device, and applies the control voltage to the V upper pole device and the V lower pole device. The forward drop correction module corrects the control voltage based on a feedforward compensation voltage determined from a forward voltage drop. The load resistance module calculates a load resistance for a load based on an average control voltage, an average bus voltage, and an average load feedback current.

BRIEF DESCRIPTION OF THE DRAWINGS

In order that the advantages of the embodiments of the invention will be readily understood, a more particular description of the embodiments briefly described above will be rendered by reference to specific embodiments that are illustrated in the appended drawings. Understanding that these drawings depict only some embodiments and are not therefore to be considered to be limiting of scope, the embodiments will be described and explained with additional specificity and detail through the use of the accompanying drawings, in which.

DETAILED DESCRIPTION

Figure 1A:
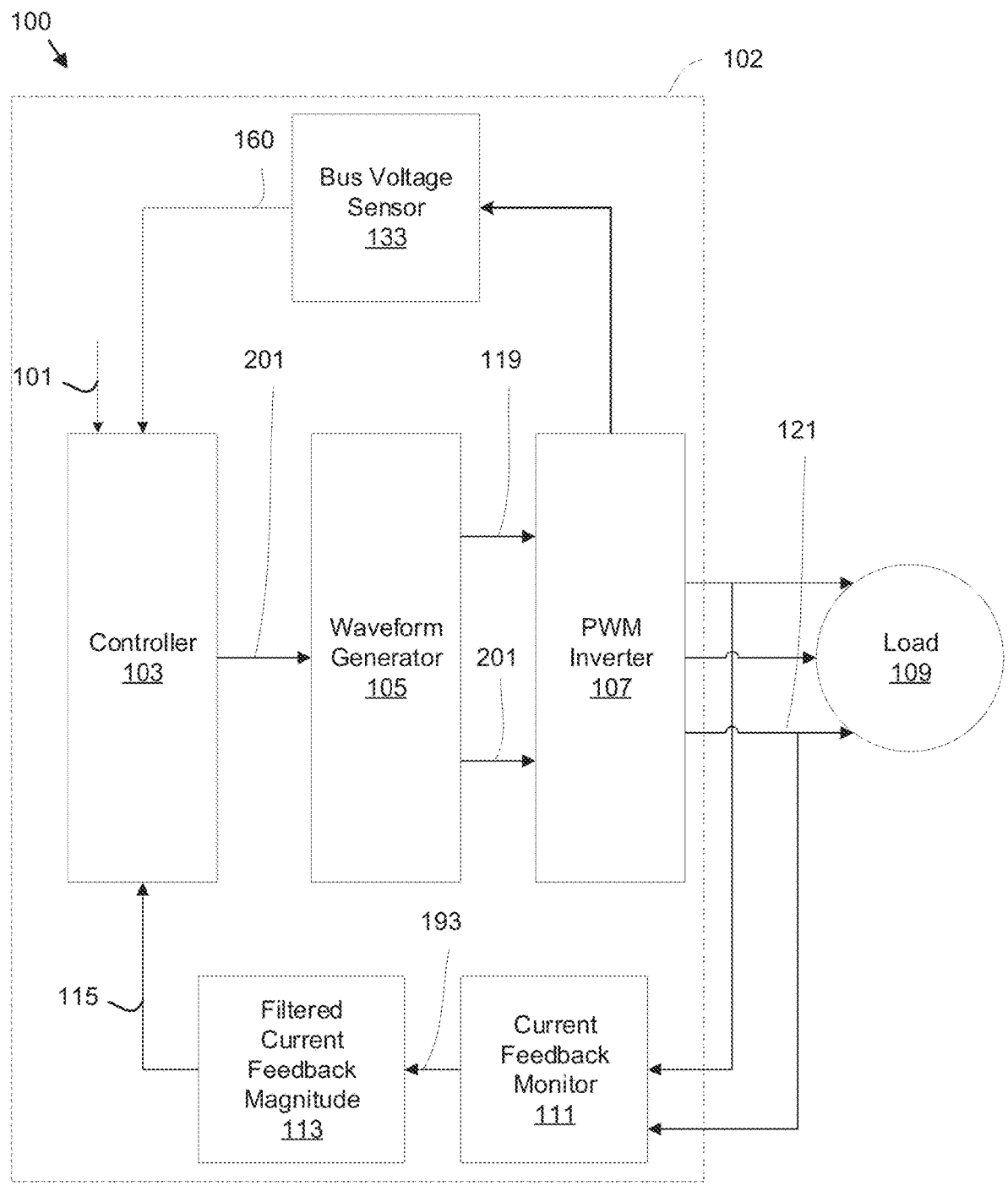
FIG. 1A is a schematic block diagram of load resistance measurement system according to an embodiment.

Reference throughout this specification to "one embodiment," "an embodiment," or similar language means that a particular feature, structure, or characteristic described in connection with the embodiment is included in at least one embodiment. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

Furthermore, the described features, advantages, and characteristics of the embodiments may be combined in any suitable manner. One skilled in the relevant art will recognize that the embodiments may be practiced without one or more of the specific features or advantages of a particular embodiment. In other instances, additional features and advantages may be recognized in certain embodiments that may not be present in all embodiments.

These features and advantages of the embodiments will become more fully apparent from the following description and appended claims, or may be learned by the practice of embodiments as set forth hereinafter. As will be appreciated by one skilled in the art, aspects of the present invention may be embodied as a system, method, and/or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module," or "system." Furthermore, aspects of the present invention may take the form of a computer program product embodied in one or more computer readable medium(s) having program code embodied thereon.

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices or the like.

Modules may also be implemented in software for execution by various types of processors. An identified module of program code may, for instance, comprise one or more physical or logical blocks of computer instructions which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of program code may be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different storage devices, and may exist, at least partially, merely as electronic signals on a system or network. Where a module or portions of a module are implemented in software, the program code may be stored and/or propagated on in one or more computer readable medium(s).

The computer readable medium may be a tangible computer readable storage medium storing the program code. The computer readable storage medium may be, for example, but not limited to, an electronic, magnetic, optical, electromagnetic, infrared, holographic, micromechanical, or semiconductor system, apparatus, or device, or any suitable combination of the foregoing.

More specific examples of the computer readable storage medium may include but are not limited to a portable computer diskette, a hard disk, a random access memory (RAM), a read-only memory (ROM), an erasable programmable read-only memory (EPROM or Flash memory), a portable compact disc read-only memory (CD-ROM), a digital versatile disc (DVD), an optical storage device, a magnetic storage device, a holographic storage medium, a micromechanical storage device, or any suitable combination of the foregoing. In the context of this document, a computer readable storage medium may be any tangible medium that can contain, and/or store program code for use by and/or in connection with an instruction execution system, apparatus, or device.

The computer readable medium may also be a computer readable signal medium. A computer readable signal medium may include a propagated data signal with program code embodied therein, for example, in baseband or as part of a carrier wave. Such a propagated signal may take any of a variety of forms, including, but not limited to, electrical, electro-magnetic, magnetic, optical, or any suitable combination thereof. A computer readable signal medium may be any computer readable medium that is not a computer readable storage medium and that can communicate, propagate, or transport program code for use by or in connection with an instruction execution system, apparatus, or device. Program code embodied on a computer readable signal medium may be transmitted using any appropriate medium, including but not limited to wire-line, optical fiber, Radio Frequency (RF), or the like, or any suitable combination of the foregoing In one embodiment, the computer readable medium may comprise a combination of one or more computer readable storage mediums and one or more computer readable signal mediums. For example, program code may be both propagated as an electro-magnetic signal through a fiber optic cable for execution by a processor and stored on RAM storage device for execution by the processor.

Program code for carrying out operations for aspects of the present invention may be written in any combination of one or more programming languages, including an object-oriented programming language such as Java, Smalltalk, C++, PHP or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). The computer program product may be shared, simultaneously serving multiple customers in a flexible, automated fashion.

The computer program product may be integrated into a client, server and network environment by providing for the computer program product to coexist with applications, operating systems and network operating systems software and then installing the computer program product on the clients and servers in the environment where the computer program product will function. In one embodiment software is identified on the clients and servers including the network operating system where the computer program product will be deployed that are required by the computer program product or that work in conjunction with the computer program product. This includes the network operating system that is software that enhances a basic operating system by adding networking features.

Furthermore, the described features, structures, or characteristics of the embodiments may be combined in any suitable manner. In the following description, numerous specific details are provided, such as examples of programming, software modules, user selections, network transactions, database queries, database structures, hardware modules, hardware circuits, hardware chips, etc., to provide a thorough understanding of embodiments. One skilled in the relevant art will recognize, however, that embodiments may be practiced without one or more of the specific details, or with other methods, components, materials, and so forth. In other instances, well-known structures, materials, or operations are not shown or described in detail to avoid obscuring aspects of an embodiment.

Aspects of the embodiments are described below with reference to schematic flowchart diagrams and/or schematic block diagrams of methods, apparatuses, systems, and computer program products according to embodiments of the invention. It will be understood that each block of the schematic flowchart diagrams and/or schematic block diagrams, and combinations of blocks in the schematic flowchart diagrams and/or schematic block diagrams, can be implemented by program code. The program code may be provided to a processor of a general-purpose computer, special purpose computer, sequencer, or other programmable data processing apparatus to produce a machine, such that the instructions, which execute via the processor of the computer or other programmable data processing apparatus, create means for implementing the functions/acts specified in the schematic flowchart diagrams and/or schematic block diagrams block or blocks.

The program code may also be stored in a computer readable medium that can direct a computer, other programmable data processing apparatus, or other devices to function in a particular manner, such that the instructions stored in the computer readable medium produce an article of manufacture including instructions which implement the function/act specified in the schematic flowchart diagrams and/or schematic block diagrams block or blocks.

The program code may also be loaded onto a computer, other programmable data processing apparatus, or other devices to cause a series of operational steps to be performed on the computer, other programmable apparatus or other devices to produce a computer implemented process such that the program code which executed on the computer or other programmable apparatus provide processes for implementing the functions/acts specified in the flowchart and/or block diagram block or blocks.

The schematic flowchart diagrams and/or schematic block diagrams in the Figures illustrate the architecture, functionality, and operation of possible implementations of apparatuses, systems, methods and computer program products according to various embodiments of the present invention. In this regard, each block in the schematic flowchart diagrams and/or schematic block diagrams may represent a module, segment, or portion of code, which comprises one or more executable instructions of the program code for implementing the specified logical function(s).

It should also be noted that, in some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated Figures.

Although various arrow types and line types may be employed in the flowchart and/or block diagrams, they are understood not to limit the scope of the corresponding embodiments. Indeed, some arrows or other connectors may be used to indicate only the logical flow of the depicted embodiment. For instance, an arrow may indicate a waiting or monitoring period of unspecified duration between enumerated steps of the depicted embodiment. It will also be noted that each block of the block diagrams and/or flowchart diagrams, and combinations of blocks in the block diagrams and/or flowchart diagrams, can be implemented by special purpose hardware-based systems that perform the specified functions or acts, or combinations of special purpose hardware and program code.

The description of elements in each figure may refer to elements of proceeding figures. Like numbers refer to like elements in all figures, including alternate embodiments of like elements.

FIG. 1A is a schematic block diagram of load resistance measurement system 100. The system 100 may drive a load 109 such as a motor. In the depicted embodiment, the load 109 is a three-phase load. The system 100 may include an apparatus 102 and the load 109. The apparatus 102 may include a controller 103, a waveform generator 105, a PWM inverter 107, a bus voltage sensor 133, a current feedback monitor 111, and a filtered current feedback magnitude 113. The controller 103 and/or waveform generator 105 may be embodied in a digital signal processor (DSP) and/or application-specific integrated circuit (ASIC) as will be described hereafter.

The controller 103 may generate a control voltage 201 in response to a control input 101 to control the load 109. The control input 101 may be a current signal that specifies a current for the load 109. For example, the control voltage 201 may specify an angular velocity and/or torque for a motor load 109 as a function of the control input 101. The waveform generator 105 may generate a waveform duty cycle signal 119 for each phase of the load 109. In the depicted embodiment, the PWM inverter 107 may generate inverter drive voltages 121 that drive the load 109 based on the control voltage 201 and the waveform duty cycle signals 119.

The load 109 is more accurately controlled if a precise load resistance of the load 109 is known. In the past, auto tuning has been used to refine estimate the load resistance. Unfortunately, as shown hereafter in FIG. 6A, the estimated load resistance was often erroneous. The embodiments described herein calculate the load resistance with greater accuracy to improve the control of the load 109 as will be described hereafter.

The bus voltage sensor 133 may measure the bus voltage 160 of the PWM inverter 107. The bus voltage sensor 133 may generate the bus voltage 160 for the controller 103. The current feedback monitor 111 may generate a current signal 193 for the inverter drive voltages 121. The filtered current feedback magnitude 113 may generate a load feedback current 115 as will be described hereafter. The load feedback current 115 may be direct-axis/quadrant-axis magnitude.

Figure 1B:
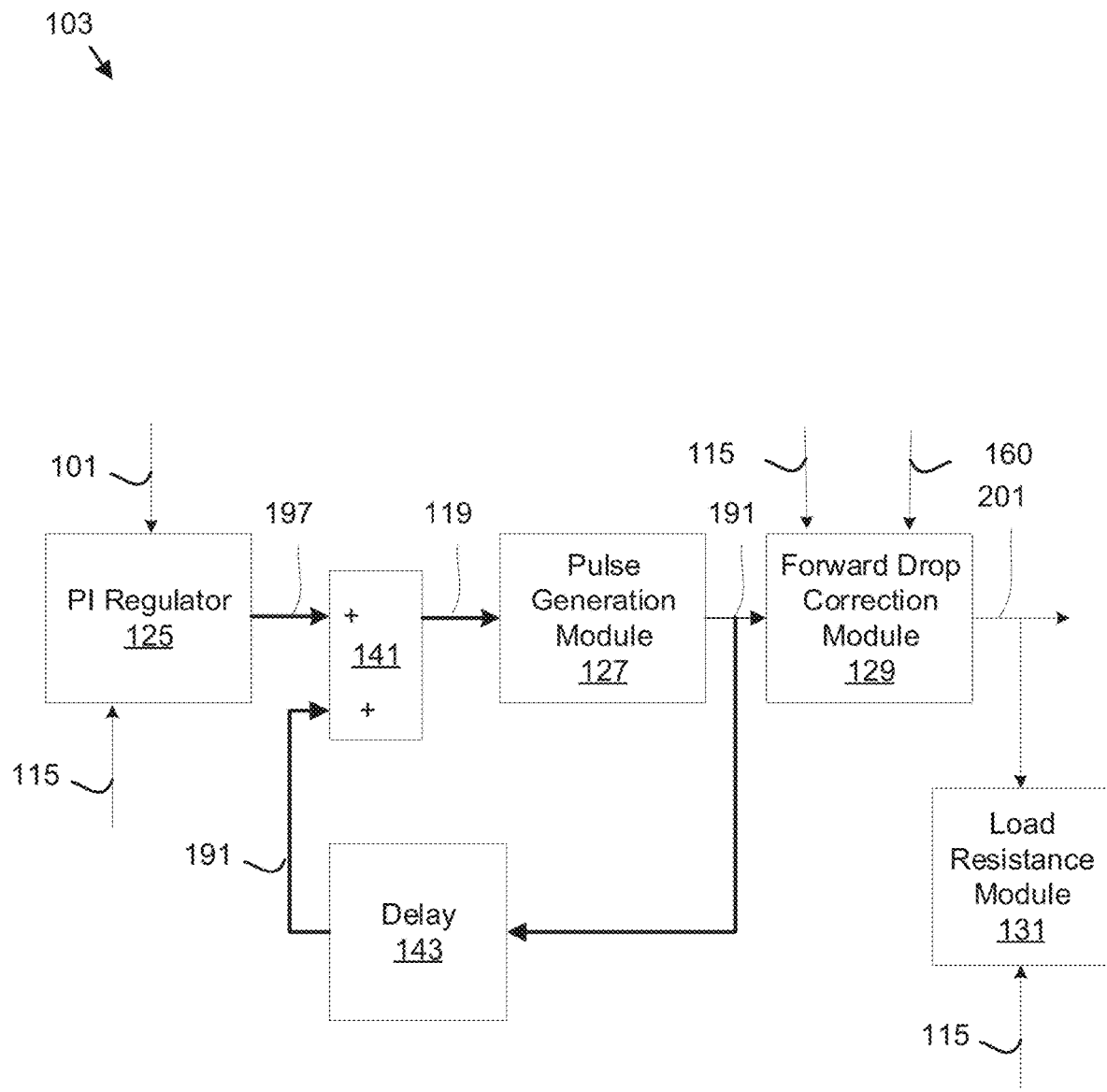
FIG. 1B is a schematic block diagram of a controller according to an embodiment.

FIG. 1B is a schematic block diagram of the controller 103. In the depicted embodiment, the controller 103 includes a proportional-integral (PI) regulator 125, a summing function 141, a pulse generation module 127, a forward drop correction module 129, a load resistance module 131, and a delay 143. The PI regulator 125, summing function 141, pulse generation module 127, forward drop correction module 129, load resistance module 131, and delay 143 may be implemented in semiconductor hardware, a DSP or ASIC, or combinations thereof.

The PI regulator 125 receives the control input 101 and the load feedback current 115 and generates a regulator signal 197. The PI regulator 125 is described in more detail in FIG. 2B. The regulator signal 197 is summed with a load voltage drop 191 by the summing function 141 to generate the waveform duty cycle signal 119 that in part drives the pulse generation module 127. In one embodiment, the load voltage drop 191 is delayed by the delay function 143.

The pulse generation module 127 receives the waveform duty cycle signal 119 and generates the load voltage drop 191. The pulse generation module 127 is described in more detail in FIG. 2C.

The forward drop correction module 129 receives the load voltage drop 191, the load feedback current 115, and an average bus voltage 160 for the waveform generator 105 and generates the control voltage 201. The control voltage 201 may be generated as a function of other signals as will be described hereafter. The forward drop correction module 129 is described in more detail in FIG. 2D.

The load resistance module 131 receives the control voltage 201 and the load feedback current 115. The load resistance module 131 may calculate a load resistance as a function of the bus voltage 160 for the waveform generator 105, the load feedback current 115, the control voltage 201. In addition, other inputs may be employed to calculate the load resistance as will be described in FIG. 2E.

Figure 2A:
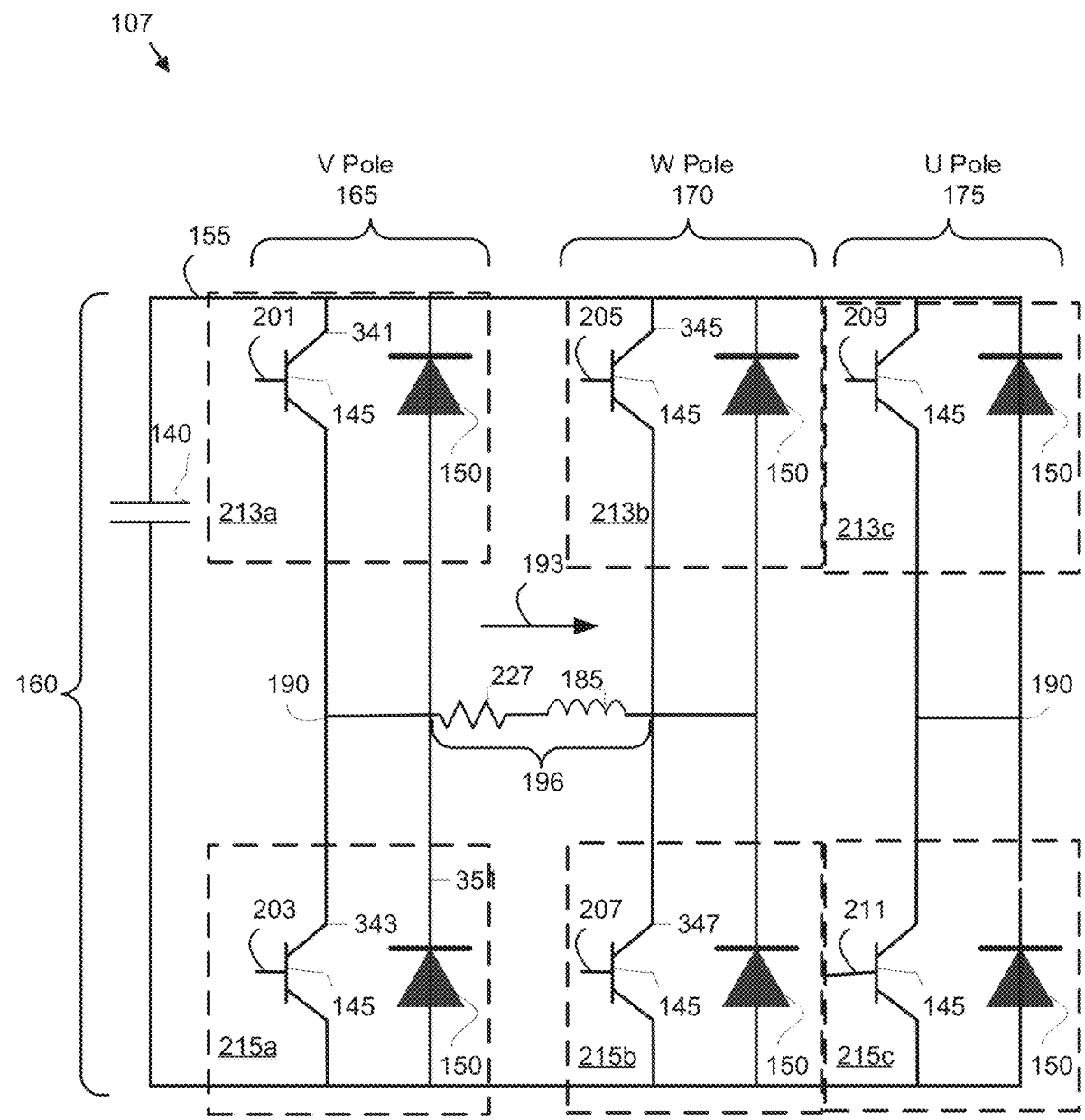
FIG. 2A is a schematic diagram of a pulse width modulation inverter according to an embodiment.

FIG. 2A is a schematic diagram of the PWM inverter 107. In the depicted embodiment, the PWM inverter 107 is a three-pole PWM inverter 107. The PWM inverter 107 includes a V pole 165, a W pole 170, and a U pole 175. In one embodiment, the U pole 175 is turned off when calculating the load resistance as will be described hereafter.

The PWM inverter 107 includes a plurality of upper pole devices 213 and lower pole devices 215. The upper pole devices 213 include an upper V pole device (Vupper) 213a, an upper W pole device (Wupper) 213b, and an upper U pole device (Uupper) 213c. The lower pole devices 215 include a lower V pole device (Vlower) 215a, a lower W pole device (Wlower) 215b, and a lower U pole device (Ulower) 215c. Each upper pole device 213 and lower pole device 215 may include a transistor 145 and a reverse recovery diode 150. Each transistor 145 may be driven by a control voltage 201/203/205/207/209/211. Each upper pole device 213 and each lower pole device 215 may be ON in response to a control voltage 201/203/205/207/209/211 being applied to the corresponding transistor 145 or OFF in response to no control voltage 201/203/205/207/209/211 being applied to the corresponding transistor 145.

A voltage V_Uigbt 341 is a voltage across the transistor 145 of the Vupper 213a. A voltage V_Vigbt 343 is a voltage across the transistor 145 of the Vlower 215a. A voltage V_Wigbt 345 is a voltage across the transistor 145 of the Wupper 213b. A voltage W_Wigbt 347 is a voltage across the transistor 145 of the Wlower 215b. A voltage V_Vdiode 351 is a voltage across the reverse recovery diode 150 of Vlower 215b.

The PWM inverter 107 further includes a capacitor 140. The bus voltage 160 may be measured across the capacitor 140. One phase of the current signal 193 between the V pole 165 and the W pole 170 is shown. The embodiments measure the forward voltage drop $V_{FD}$ 196 across a load resistance 227 and a load inductance 185 as will be described hereafter. A two device voltage drop 190 between the V pole device 165 and the U pole device 175 may be used to calculate the load resistance 227 as will be described hereafter.

Figure 2B:
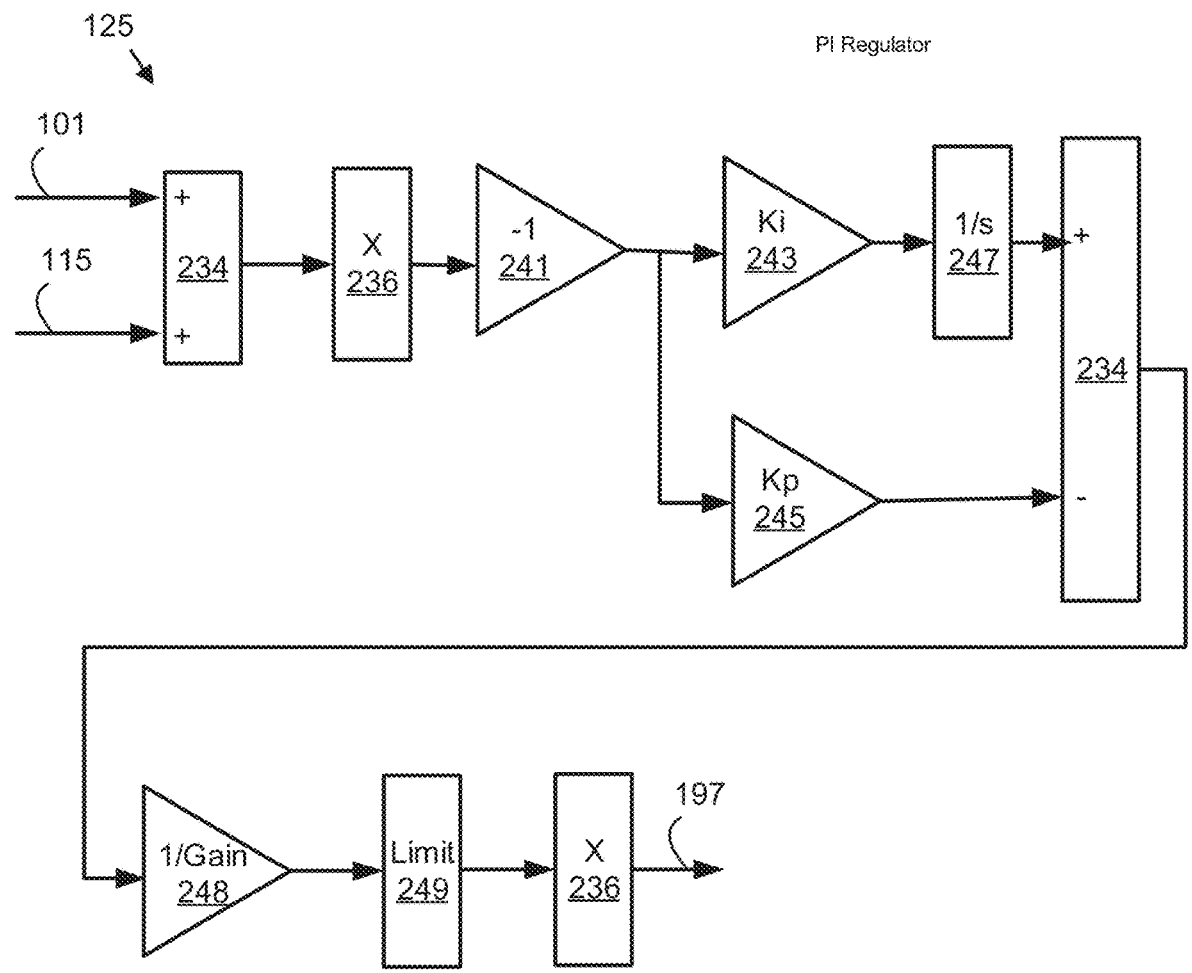
FIG. 2B is a schematic block diagram of a proportional-integral regulator according to an embodiment.

FIG. 2B is a schematic block diagram of the PI regulator 125. In the depicted embodiment, the PI regulator 125 includes one or more difference functions 234, one or more multiplier functions 236, an inverter 241, an integral gain 243, a proportional gain 245, a unit step function 247, an inverse gain function 248, and a limit function 249. In one embodiment, the PI regulator 125 receives the control input 101 and the load feedback current 115 and generates the regulator signal 197.

Figure 2C:
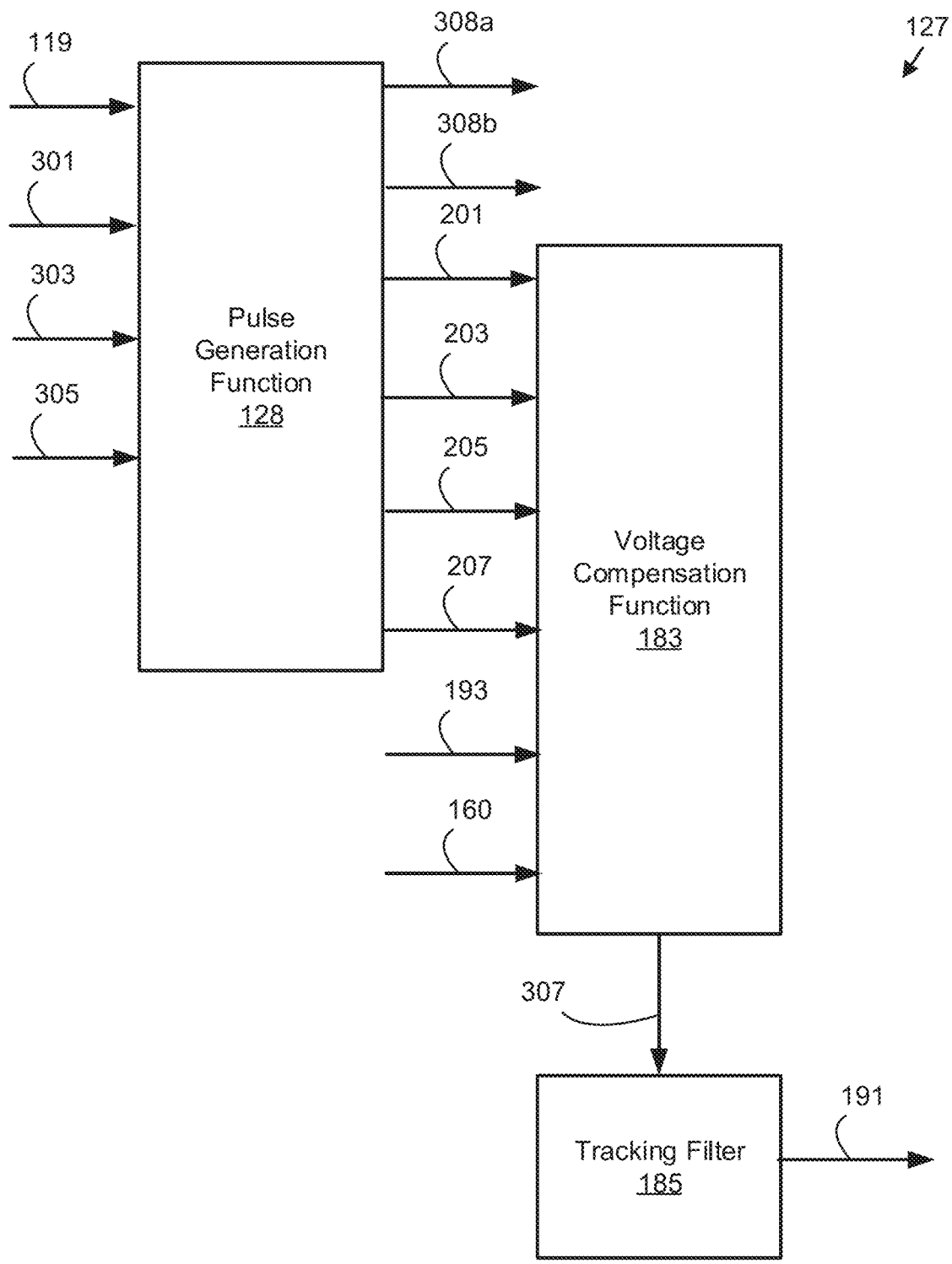
FIG. 2C is a schematic block diagram of a pulse generation module and delay according to an embodiment.
Figure 2D:
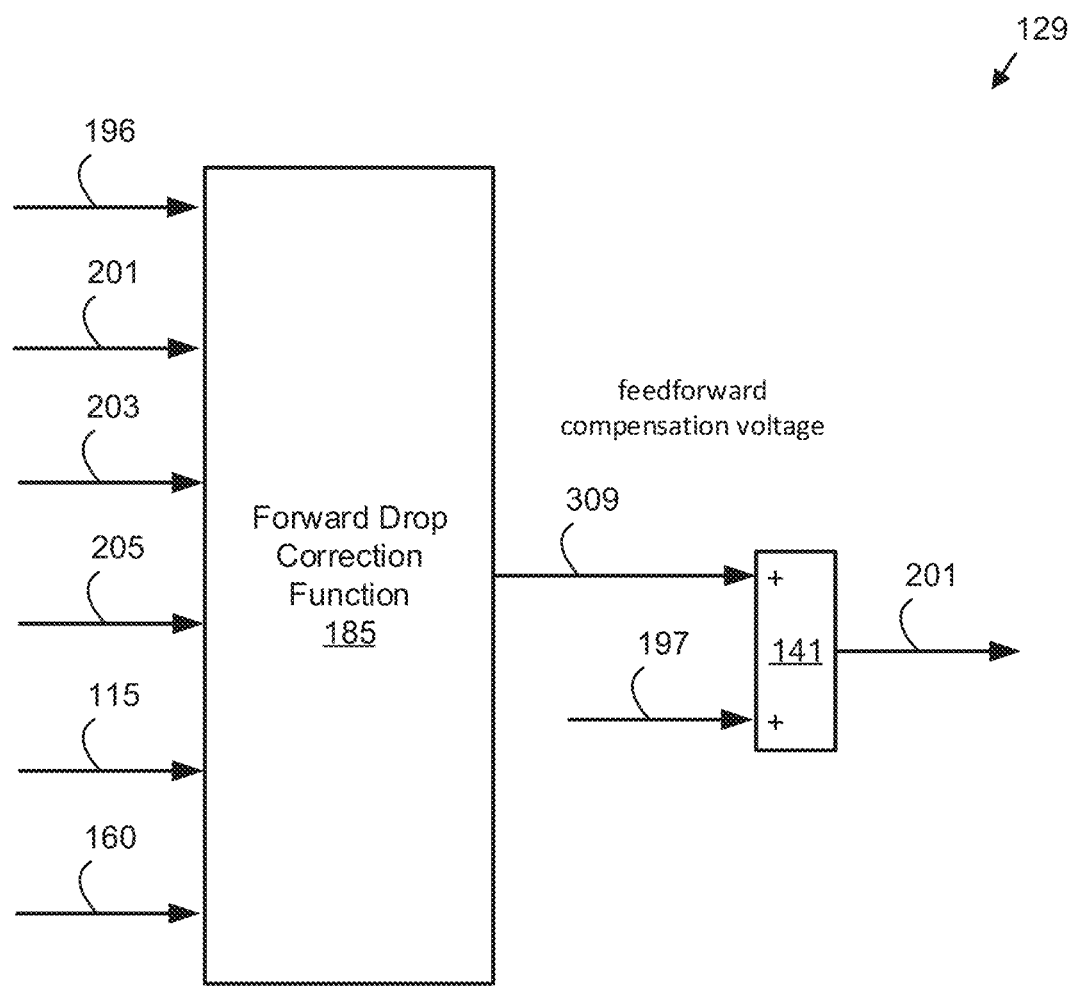
FIG. 2D is a schematic block diagram of a forward drop correction module according to an embodiment.

FIG. 2C is a schematic block diagram of the pulse generation module 127. In the depicted embodiment, the pulse generation module includes a pulse generation function 128, a voltage compensation function 183, and a tracking filter 185. The pulse generation function 128 receives the waveform duty cycle signal 119, a control voltage time interval 301, a time signal 303, and a start of control (SOC) 305 for pulse calculation states, and generates the control voltages 201/203/205/207. In addition, the pulse generation function 128 may generate one or more timing signals 308a-b. The voltage compensation function 183 receives the control voltages 201/203/205/207, the current signal 193, and the bus voltage 160 and generates a voltage compensation signal 307. The voltage compensation signal 307 is filtered with the tracking filter 185 to generate the load drop voltage 191. FIG. 2D is a schematic block diagram of the forward drop correction module 129. In the depicted embodiment, the forward drop correction module 129 includes a forward drop correction function 185 and a summing function 141. The forward drop correction function 185 receives the forward voltage drop 196, the control voltages 201/203/205, the load feedback current 115, and the bus voltage 160 and generates a feedforward compensation voltage 309. The feedforward compensation voltage 309 may be determined from the forward voltage drop 196. In one embodiment, the feedforward compensation voltage $V_{FD}$ 309 may be calculated using Equation 1 for the load feedback current 115 being greater than zero, Wupper 213b being ON, Vlower 215b being ON, and wherein Vbus is the bus voltage 160.

$$V_{FD} = V\text{bus} - (V\_W\text{igbt} - V\_V\text{igbt})  \quad\text{Equation 1}$$

In addition, the feedforward compensation voltage $V_{FD}$ 309 may be calculated using Equation 2 for the load feedback current 115 being greater than zero, Wupper 213b being ON, and Vupper 213a being ON.

$$V_{FD} = V\text{bus} - (-V\_W\text{igbt} - V\_V\text{diode})  \quad\text{Equation 2}$$

Figure 2E:
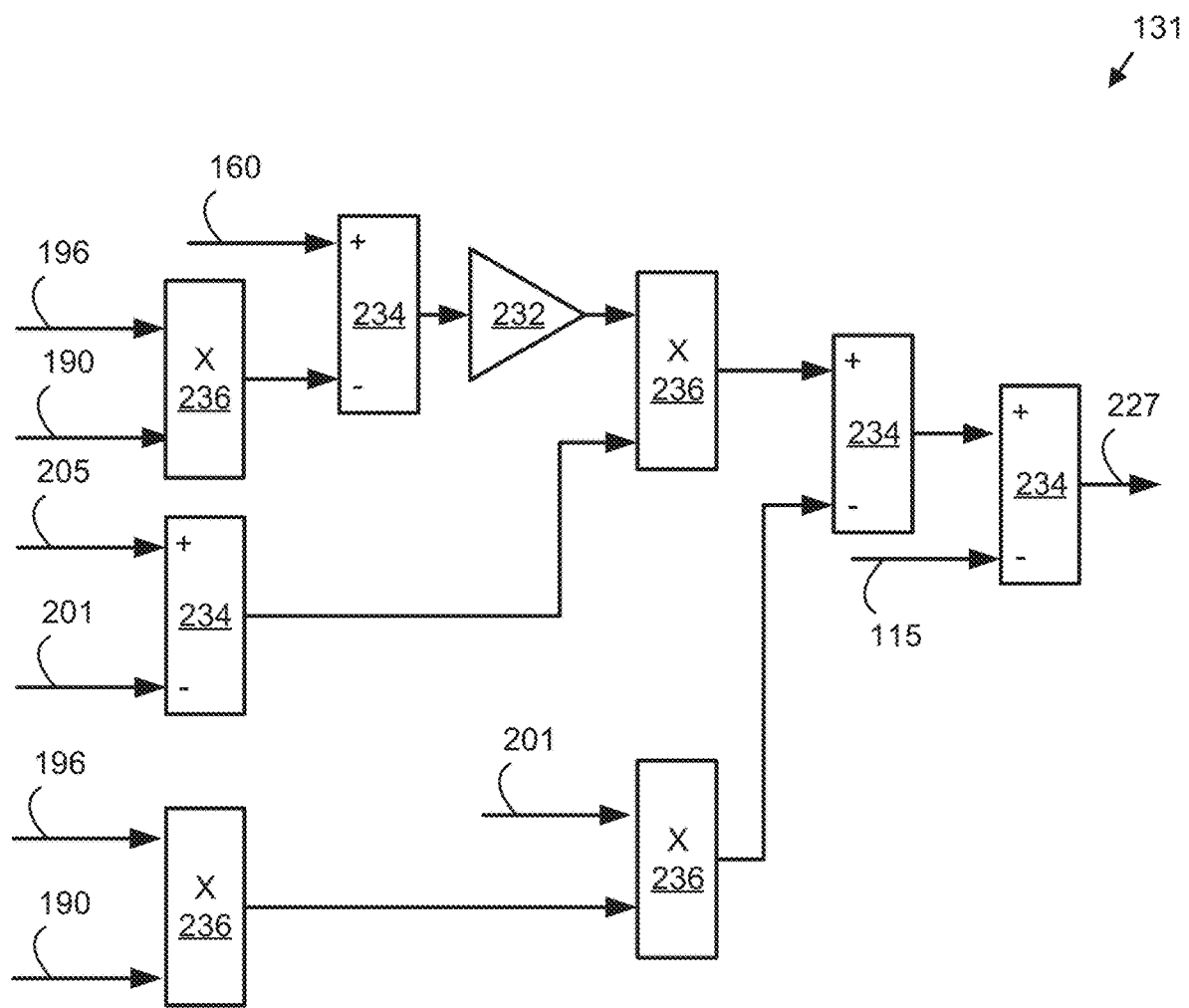
FIG. 2E is a schematic block diagram of a load resistance module according to an embodiment.

FIG. 2E is a schematic block diagram of the load resistance module 131. In the depicted embodiment, the load resistance module 131 includes one or more multiplier functions 236, one or more difference functions 234, and a gain function 232. The load resistance module 131 receives the forward voltage drop 196, the two device voltage drop 190, the control voltages 201/205, and the load feedback current 115 and generates the load resistance 227.

The load resistance module 131 may calculate a gain G of the gain function 232. The gain G may be calculated using Equation 3, where $V_{busavg}$ is the average bus voltage 160 and $V_{Igbt}$ is the two device voltage drop 190.

$$G = V_{busavg} - (2 * V_{Igbt})/2  \quad\text{Equation 3}$$

The load resistance module 131 may further calculate a load voltage $V_{load}$. The load voltage $V_{load}$ may be calculated using Equation 4, wherein $RS_{avg}$ is the average regulator signal 197.

$$V_{load} = ((1 - R_{Savg}) * G - (2 * V\_V\text{diode} * R_{Savg})  \quad\text{Equation 4}$$

In one embodiment, the load resistance $R_S$ 227 is calculated using Equation 5, where CV is the control voltage 201 and LFC is the load feedback current 115.

$$R_S = \text{CV}/\text{LFC}  \quad\text{Equation 5}$$

In addition, the load resistance $R_S$ 227 may be calculated using Equation 6.

$$R_S = V_{load}/\text{LFC}  \quad\text{Equation 6}$$

Figure 3:
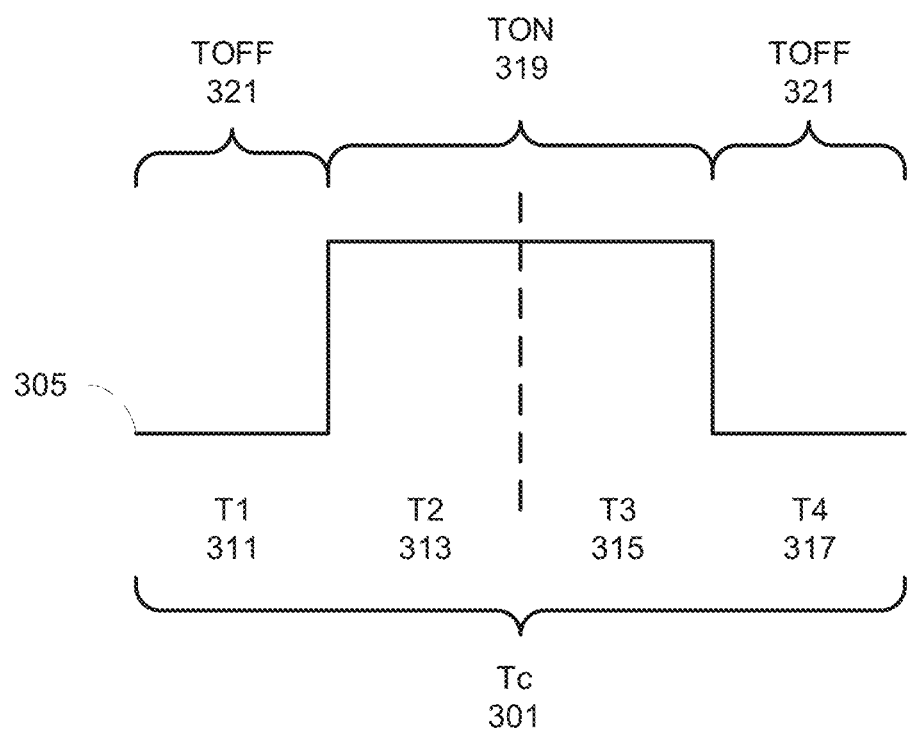
FIG. 3 is an illustration of a control voltage time interval according to an embodiment.

FIG. 3 is an illustration of the control voltage time interval 301 of the control voltage 201. In the depicted embodiment, the control voltage time interval 301 begins at the SOC 305 and includes an on-time interval (TON) 319 for the control voltage 201 wherein Vupper 213a is ON and an off time interval (TOFF) 321 for the control voltage 201 wherein Vupper 213a is OFF. The control voltage time interval 301, TON 319, and TOFF 321 may be specified by the timing signals 308. TON 319 may be calculated using Equation 7, where $V_{ref}$ is a reference voltage, $V_{bus}$ is the bus voltage 160, and Tc is the control voltage time interval 301.

$$TON=(1+V_{ref}/(V_{bus}/2))*Tc/2 \qquad \text{Equation 7}$$

TOFF may be calculated used Equation 8.

$$TOFF=Tc-TON \qquad \text{Equation 8}$$

A half on time interval (TONHALF) may be calculated using Equation 9.

$$TONHALF=TON/2 \qquad \text{Equation 9}$$

A half off time interval (TOFFHALF) may be calculated using Equation 10.

$$TOFFHALF=TOFF/2 \qquad \text{Equation 10}$$

The feedforward compensation voltage 309 may be generated as a function of TON 319, TOFF 321, TONHALF, and TOFFHALF as will be described hereafter. In a certain embodiment, the control voltage time interval 301 is divided into a first time interval (T1) 311, a second time interval (T2) 313, a third time interval (T3) 315, and a fourth time interval (T4) 317.

Figure 4A:
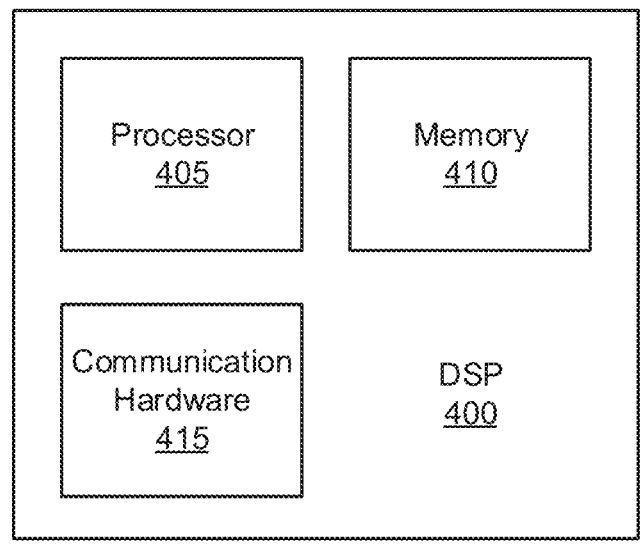
FIG. 4A is a schematic block diagram of a digital signal processor according to an embodiment.

FIG. 4A is a schematic block diagram of the DSP 400. The DSP 400 may include elements of the controller 103 and/or the waveform generator 105. In the depicted embodiment, the DSP 400 includes a processor 405, a memory 410, and communication hardware 415. The memory 410 may be semiconductor storage registers. In addition, the memory 410 may include a semiconductor storage device, a hard disk drive, an optical storage device, or combinations thereof. The memory 410 may store code. The processor 405 may execute the code. The communication hardware 415 may communicate with other devices.

Figure 4B:
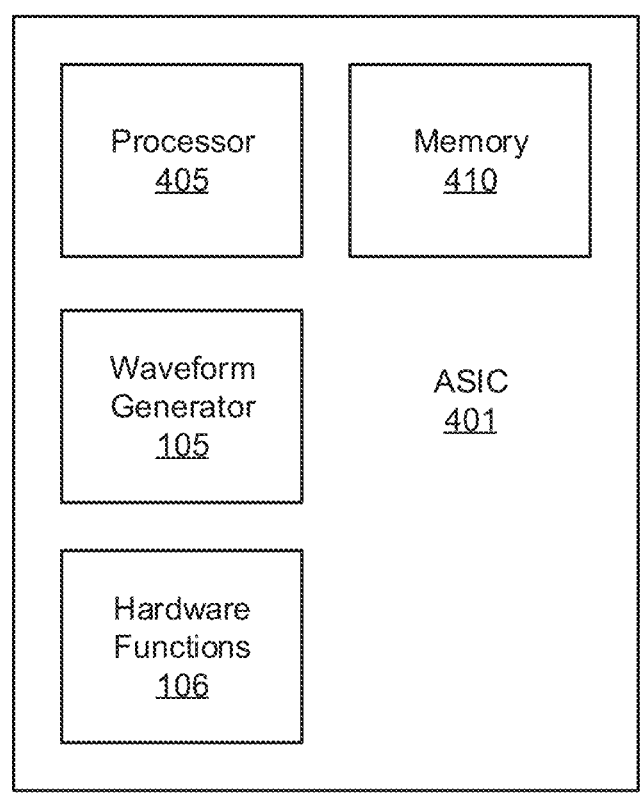
FIG. 4B is a schematic block diagram of an application-specific integrated circuit according to an embodiment.

FIG. 4B is a schematic block diagram of the ASIC 401. In the depicted embodiment, the ASIC 401 includes the processor 405, the memory 410, the waveform generator 105, and hardware functions 106. The hardware functions 106 may be implemented in semiconductor gates. The processor 405, memory 410, and hardware functions 406 may implement the controller 103.

Figure 4C:
FIG. 4C is a schematic block diagram of system data according to an embodiment.

FIG. 4C is a schematic block diagram of system data 450. The system data 450 maybe organized as a data structure in a memory 410 and/or as register values including timer registers. In the depicted embodiment, the system data 450 includes a timer 451, a time 453, a delta time 467, interval data 455, a measurement time interval 457, bus voltage data 459, control voltage data 461, regulator signal data 463, load feedback current data 465, and load resistance data 469.

The timer 451 may count elapsed time. The time 453 may record a specific time. The delta time 467 may be added to the timer 451 to generate the time 453. The interval data 455 may store values for the control voltage time interval 301, TON 319, TOFF 321, TONHALF, TOFFHALF, T1 311, T2 313, T3 315, and T4 317.

The measurement time interval 457 may specify a time interval for measuring the load resistance 227 and related values. The bus voltage data 459 may store the bus voltage 160 at a plurality of instances. The control voltage data 461 may store the control voltage 201 at a plurality of instances. The regulator signal data 463 may store the regulator signal 197 at a plurality of instances. The load feedback current data 465 may store the load feedback current 115 at a plurality of instances. The load resistance data 469 may store the load resistance 227 from a plurality of calculations.

Figure 5A:
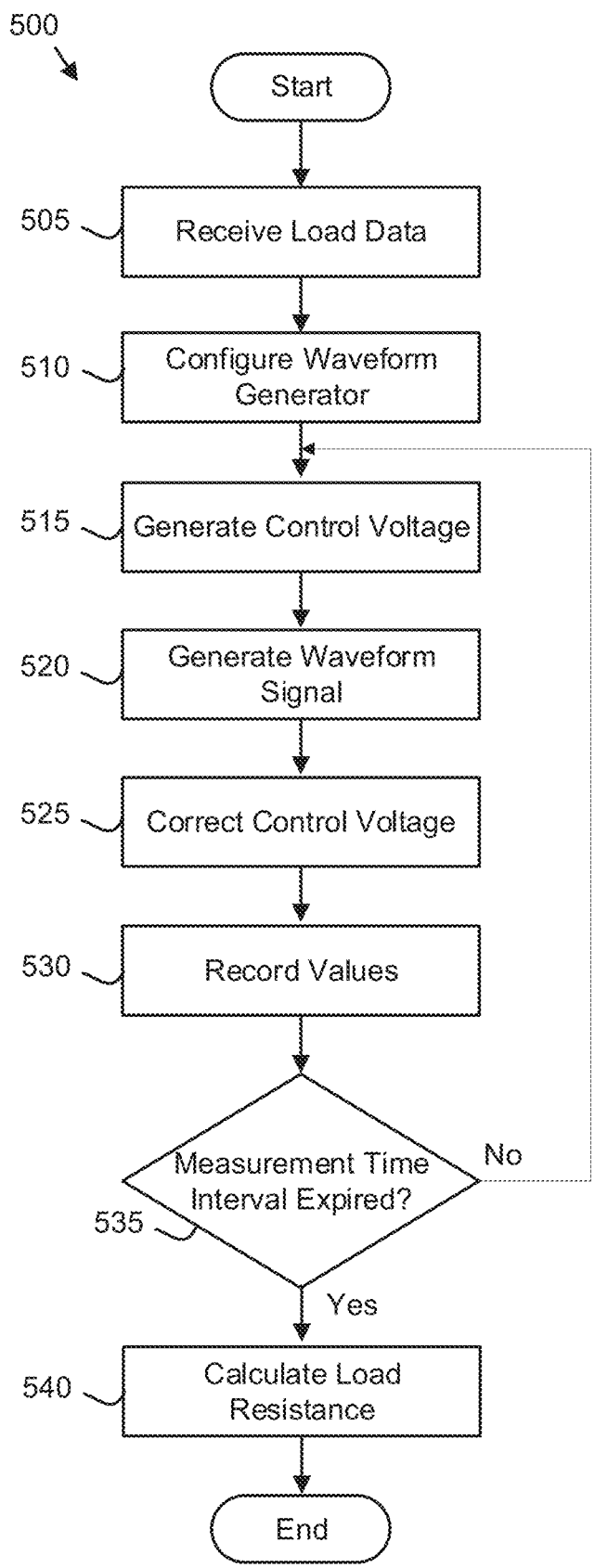
FIG. 5A is a schematic flow chart diagram of a load resistance calculation method according to an embodiment.

FIG. 5A is a schematic flow chart diagram of a load resistance calculation method 500. The method 500 may be performed by the system 100 and/or the apparatus 102. In particular, the method 500 may be performed by the processor 405 of the DSP 400 and/or ASIC 401. The method 500 may further be performed by the hardware functions 106.

The method 500 starts, and in one embodiment, the apparatus 102 receives 505 load data for the load 109. In one embodiment, the load data includes the current signal 193 as a function of the forward voltage drop 196. In addition, the load data may include a current through a reverse recovery diode 150 as a function of a voltage across the reverse recovery diode 150. The DSP 400 and/or ASIC 401 may receive the load data over a data bus.

The apparatus 102 may configure 510 the waveform generator 105. In one embodiment, the PWM inverter 107 turns off the U phase pole 175, turns on Wupper 213b, turns off Wlower 215b, and applies the control voltages 201/203 to Vupper 213a and the Vlower 215a.

The apparatus 102 further generates 515 the control voltage 201. The control voltage 201 may be generated 515 as off for T1 311, on for T2 313, on for T3 315, and off for a T4 317 as shown in FIG. 3.

The apparatus 102 further generates 520 the waveform duty cycle signal 119. In one embodiment, the waveform generator 105 generates 520 the waveform duty cycle signal 119 as a function of the control voltage 201.

In one embodiment, the apparatus 102 corrects 525 the control voltage 201 based on the feedforward compensation voltage FCV 309. The feedforward compensation voltage FCV 309 may be determined from the forward voltage drop 196. The corrected control voltage CV 201 may be calculated using Equation 11.

$$CV=RF+FCV \qquad \text{Equation 11}$$

The apparatus 102 may record 530 measured values including, but not limited to the bus voltage 160, the control voltage 201, the regulator signal 197, and the load feedback current 115. In one embodiment, the apparatus 102 calculates and records 530 an average bus voltage 160, an average control voltage 201, an average regulator signal 197, and a load feedback current 115 to the bus voltage data 459, the control voltage data 461, the regulator signal data 463, and the load feedback current data 465 respectively. The average bus voltage 160, the average control voltage 201, the average regulator signal 197, and the load feedback current 115 may be used in calculations in place of the bus voltage 160, the control voltage 201, and the load feedback current 115.

The apparatus 102 may record 530 measured values for the measurement time interval 457. In one embodiment, the measurement time interval 457 is in the range of 0.01 to 5 seconds. The apparatus 102 further determines 535 if the measurement time interval 457 is expired. If the measurement time interval 457 is not expired, the apparatus 102 continues to generate 515 the control voltage 201 corrected base on the feedforward compensation voltage 309.

If the measurement time interval 457 is expired, the apparatus 102 calculates 540 the load resistance 227 and the method 500 ends. The load resistance 227 may be calculated 540 based on an average control voltage 201, an average bus voltage 160, and an average load feedback current 115. In addition, the load resistance 227 may be calculated 540 as a function of the bus voltage 160, the load feedback current 115, the control voltage 201, the Wupper on signal control voltage 205, the forward voltage drop 196, and the load voltage drop 191. In one embodiment, the load resistance 227 is calculated 540 using Equation 7. In addition, the load resistance 227 may be calculated 540 using Equation 8.

Figure 5B:
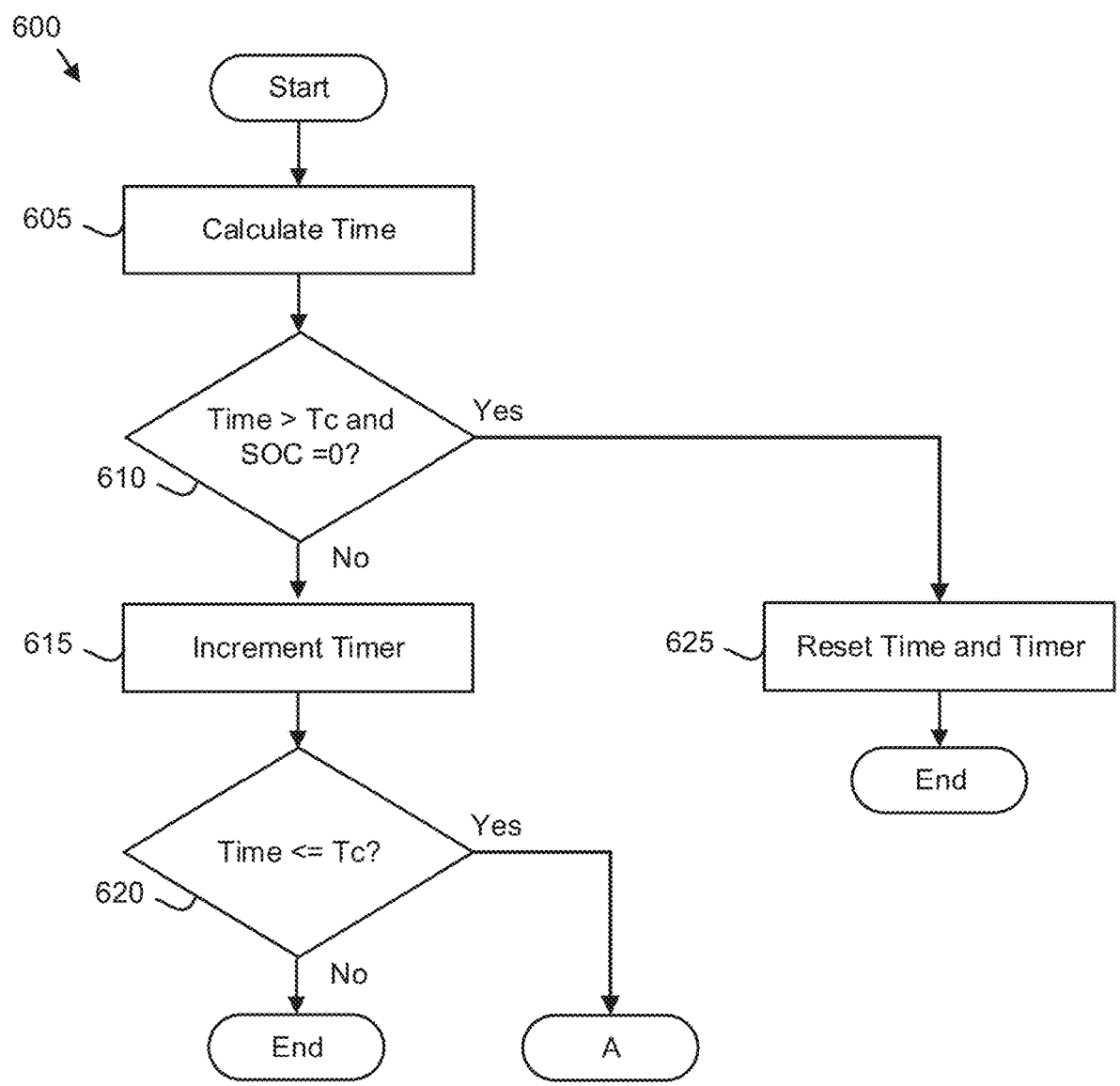
FIGS. 5B-C are schematic flow chart diagrams of a waveform signal generation method according to an embodiment.
Figure 5C:
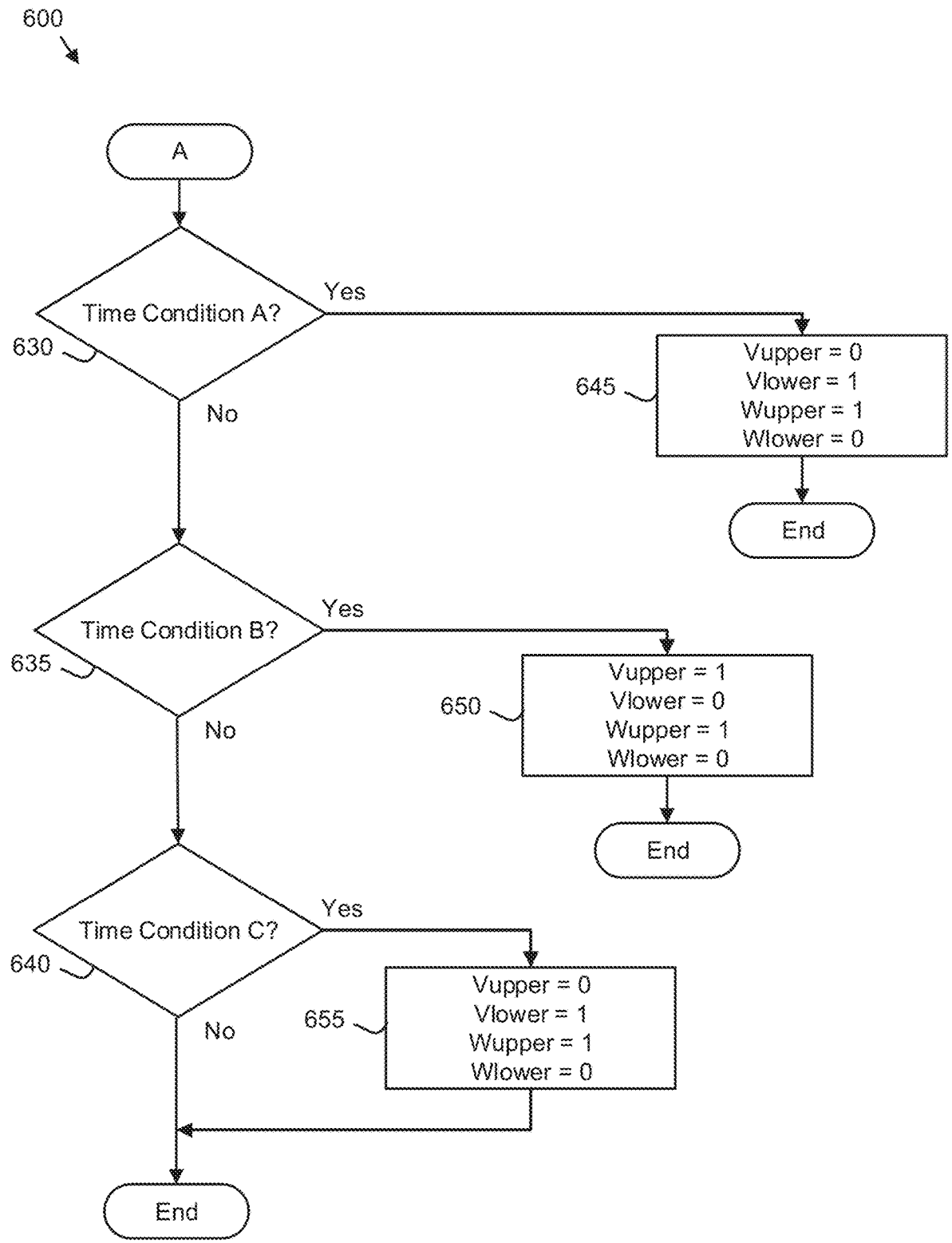

FIGS. 5B-C are schematic flow chart diagrams of a waveform signal generation method 600. The method 600 may be performed by the system 100 and/or the apparatus 102. In particular, the method 600 may be performed by the processor 405 of the DSP 400 and/or ASIC 401. The method 600 may further be performed by the hardware functions 106.

The method 600 starts, and in one embodiment, the processor 405 calculates 605 the time 453. The time 453 may be calculated 605 as the sum of the timer 451 and the delta time 467. The processor 405 further determines 610 if the time 453 is greater than the control voltage time interval Tc 301 and if the SOC 305 equals zero.

If the timer 453 is not greater than the control voltage time interval 301 or if the SOC 305 does not equal zero, the processor 405 may increment 615 the timer 451. The timer 451 may be incremented by the delta time 467. The processor 405 may further determine 620 if the time 453 is less than or equal to the control voltage time interval Tc 301. If the time 453 is not less than or equal to the control voltage time interval 301, the method 600 ends.

If the time 453 is less than or equal to the control voltage time interval 301, the processor 405 may determine 630 if time condition A is satisfied. Time condition A may be satisfied if the time 453 is less than or equal to TOFFHALF. If time condition A is satisfied, the processor 405 sets 645 the control voltage 201 for Vupper 213a equal to zero, the control voltage 203 for Vlower 215a equal to one, wherein one is fully asserted, the control voltage 205 for Wupper 213b to one, and the control voltage 207 for Wlower 215b to zero and the method 600 ends. In addition, the control voltage 209 for Uupper 213c and the control voltage 211 for Ulower 215c are both set to zero.

If time condition A is not satisfied, the processor 405 may determine 635 if time condition B is satisfied. Time condition B may be satisfied if the time 453 is greater than TOFFHALF AND if the time 453 is less than or equal to the control voltage time interval Tc 301 minus TON 319. If time condition B is satisfied, the processor 405 sets 650 the control voltage 201 for Vupper 213a equal to one, the control voltage 203 for Vlower 215a equal to zero, the control voltage 205 for Wupper 213b to one, and the control voltage 207 for Wlower 215b to zero and the method 600 ends. In addition the control voltage 209 for Uupper 213c and the control voltage 211 for Ulower 215c are both set to zero.

If time condition B is not satisfied, the processor 405 determine 640 if time condition C is satisfied. Time condition C may be satisfied if the time 453 is greater than the sum of TOFFHALF and TON 319 AND if the time 453 is less than or equal to the control voltage time interval Tc 301. If time condition C is satisfied, the processor 405 sets 655 the control voltage 201 for Vupper 213a equal to zero, the control voltage 203 for Vlower 215a equal to one, the control voltage 205 for Wupper 213b to one, and the control voltage 207 for Wlower 215b to zero and the method 600 ends. In addition, the control voltage 209 for Uupper 213c and the control voltage 211 for Ulower 215c are both set to zero. If time condition C is not satisfied, the method 600 ends.

Returning to step 610, if the timer 453 is greater than the control voltage time interval 301 AND the SOC 305 equals zero, the processor 405 may reset 625 the time 453 and the timer 451 20 and the method 600 ends.

Figure 6A:
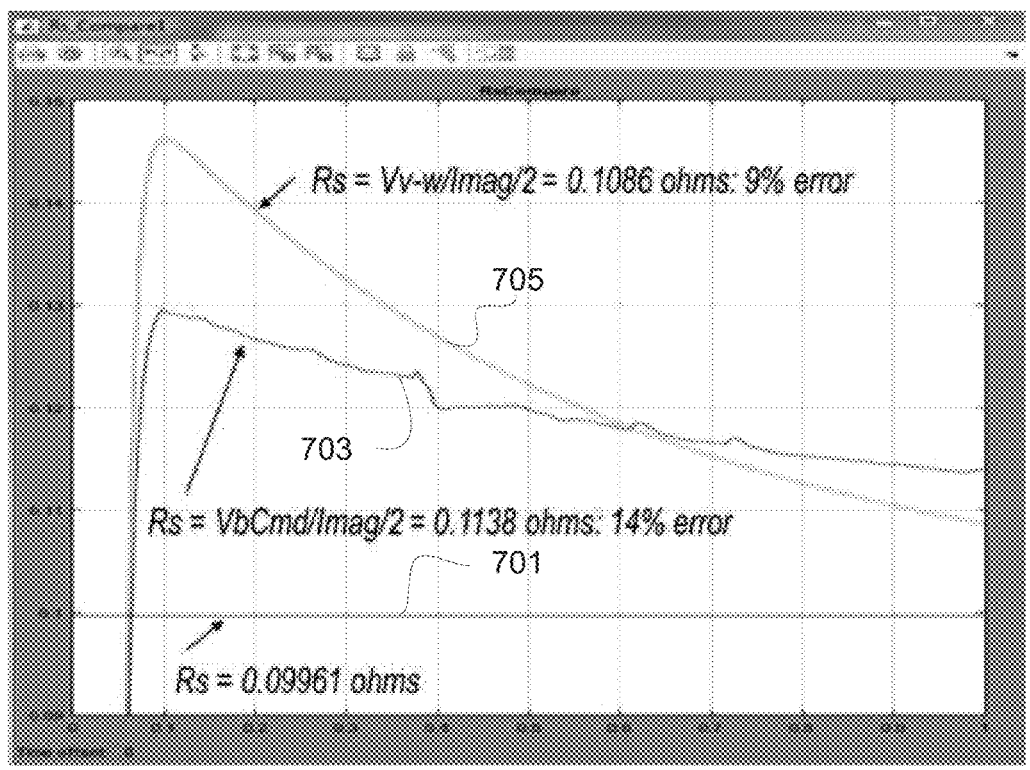
FIG. 6A is a graph of load resistance calculation results according to the prior art.

FIG. 6A is a graph of exemplary load resistance calculation results in the prior art. In the depicted embodiment, an ideal load resistance 701 is compared to iterative calculations of a second load resistance RS 703 and a third load resistance 705. In one embodiment, the second load resistance RS 703 is calculated using Equation 12 and the third load resistance $R_S$ 705 is calculated using Equation 13.

$$R_S = CV/LFC/2 \qquad \text{Equation 12}$$

$$R_S = CV/V_{FD}/2 \qquad \text{Equation 13}$$

As shown, the iteratively calculated load resistances 703/705 have a significant error from the ideal load resistance 701.

Figure 6B:
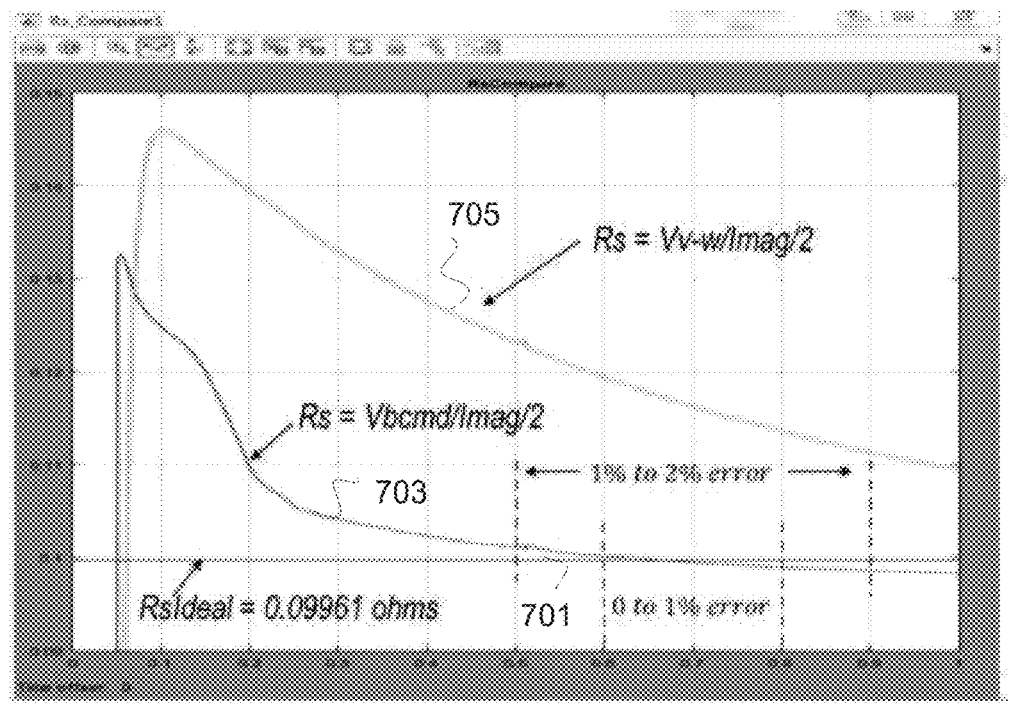
FIG. 6B is a graph of load resistance calculation results according to an embodiment.

FIG. 6B is a graph of exemplary load resistance calculation results for the embodiments. In the depicted embodiment, the ideal load resistance 701 is again compared to the iterative calculations of the second load resistance RS 703 and the third load resistance 705. As shown, the error for the first and second calculated load resistance 702/703 is significantly reduced over the prior art.

Problem/Solution

Control of a load 109 such as a motor is improved when the load resistance 227 of the load 109 is known. While load data may include estimates of the load resistance 227, measuring the load resistance 227 of the load 109 can improve the accuracy of the estimate. As a result, control algorithms may be tuned and the load 109 may be more accurately controlled.

Unfortunately, in the past, significant errors in load resistance measurements have occurred because of modulations in quadrant-axis current, forward voltage drops, circulating currents from a load snubber resistance, and parasitic effects. The embodiments correct the control voltage 201 based on the feedforward compensation voltage 309 to increase the accuracy of the load resistance calculation. As a result, the load resistance 227 is calculated with greater accuracy, improving the control of the load 109.

This description uses examples to disclose the invention and also to enable any person skilled in the art to practice the invention, including making and using any devices or systems and performing any incorporated methods. The patentable scope of the invention is defined by the claims and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. An apparatus comprising:
   a pulse generation module that drives a pulse width modulation (PWM) inverter in response to a control voltage, the PWM inverter comprising a U phase pole, a V phase pole, and a W phase pole, wherein each U, V, and W phase pole comprises an upper pole device and a lower pole device, wherein the PWM inverter turns off the U phase pole, turns on the W upper pole device (Wupper), turns off the W lower pole device (Wlower), and applies the control voltage to the V upper pole device (Vupper) and the V lower pole device (Vlower);
a forward drop correction module that corrects the control voltage based on a feedforward compensation voltage determined from a forward voltage drop; and
a load resistance module that calculates a load resistance for a load based on an average control voltage, an average bus voltage, and an average load feedback current.

2. The apparatus of claim 1, wherein the load resistance is further calculated as a function of the bus voltage for the waveform generator, the load feedback current, the control voltage, a Wupper on signal control voltage, the forward voltage drop, and a load voltage drop.

3. The apparatus of claim 1, the apparatus further comprising a proportional-integral (PI) regulator that generates a regulator signal as a function of a control input and a load feedback current, wherein the regulator signal is added to the feedforward compensation voltage to generate the control voltage.

4. The apparatus of claim 1, wherein the feedforward compensation voltage is generated as function of an on-time interval (TON) for the control voltage, wherein TON=(1+$V_{ref}/(V_{bus}/2))$*Tc/2, where $V_{ref}$ is a reference voltage, $V_{bus}$ is the bus voltage, and Tc is a control voltage time interval 301, an off time interval (TOFF) for the control voltage, wherein TOFF=Tc−TON, a half on time interval (TONHALF), wherein TONHALF=TON/2, and a half off time interval (TOFFHALF), wherein TOFFHALF=TOFF/2.

5. The apparatus of claim 4, wherein the forward voltage drop $V_{FD}$ is calculated as:
$V_{FD}$=Vbus−(V_Wigbt−V_Vigbt) for the load feedback current being greater than zero, Wupper being ON, and Vlower being ON, where Vbus is the bus voltage, V_Wigbt is a voltage across a transistor of the Wupper, and V_Vigbt is a voltage across a transistor of the N Vlower; and
$V_{FD}$=Vbus−(−V_Wigbt−V_Vdiode) for the load feedback current being greater than zero, Wupper being ON, and Vupper being ON, where V_Vdiode is a voltage across a diode of Vlower.

6. The apparatus of claim 5, wherein the control voltage is generated as off for a first time interval (T1) calculated as T1=Tc−TON−TONHALF, the control voltage is on for a second time interval (T2) calculated as T2=Tc−TONHALF−TOFF, the control voltage is on for a third time interval (T3) calculated as T3=Tc−TOFF−TONHALF, and the control voltage is off for a fourth time interval (T4) calculated as T3=Tc−TON−TOFFHALF.

7. The apparatus of claim 1, wherein the load resistance is further calculated as the control voltage divided by the load feedback current.

8. The apparatus of claim 1, wherein the load feedback current is a direct-axis/quadrant-axis magnitude.

9. The apparatus of claim 1, the apparatus further comprising a bus voltage sensor that generates the bus voltage for the PWM inverter.

10. The apparatus of claim 1, the apparatus further comprising a voltage compensation function and a tracking filter that generate a load voltage drop.

11. A method comprising:
generating an inverter drive voltages with a pulse width modulation (PWM) inverter in response to a control voltage, the PWM inverter comprising a U phase pole, a V phase pole, and a W phase pole, wherein each U, V, and W phase pole comprises an upper pole device and a lower pole device, wherein the PWM inverter turns off the U phase pole, turns on the W upper pole device (Wupper), turns off the W lower pole device (Wlower), and applies the control voltage to the V upper pole device (Vupper) and the V lower pole device (Vlower);
correcting the control voltage based on a feedforward compensation voltage determined from a forward voltage drop; and
calculating a load resistance for a load based on an average control voltage, an average bus voltage, and an average load feedback current.

12. The method of claim 11, wherein the load resistance is further calculated as a function of the bus voltage for the waveform generator, the load feedback current, the control voltage, a Wupper on signal control voltage, the forward voltage drop, and a load voltage drop.

13. The method of claim 11, wherein a regulator signal is generated as a function of a control input and a load feedback current, wherein the regulator signal is added to the feedforward compensation voltage to generate the control voltage.

14. The method of claim 11, wherein the feedforward compensation voltage is generated as function of an on-time interval (TON) for the control voltage, wherein TON=(1+$V_{ref}/(V_{bus}/2))$*Tc/2, where $V_{ref}$ is a reference voltage, $V_{bus}$ is the bus voltage, and Tc is a control voltage time interval, an off time interval (TOFF) for the control voltage, wherein TOFF=Tc−TON, a half on time interval (TONHALF), wherein TONHALF=TON/2, and a half off time interval (TOFFHALF), wherein TOFFHALF=TOFF/2.

15. The method of claim 14, wherein the forward voltage drop $V_{FD}$ is calculated as:
$V_{FD}$=Vbus−(V_Wigbt−V_Vigbt) for the load feedback current being greater than zero, Wupper being ON, and Vlower being ON, where Vbus is the bus voltage, V_Wigbt is a voltage across a transistor of the Wupper, and V_Vigbt is a voltage across a transistor of the Vlower; and
$V_{FD}$=Vbus−(−V_Wigbt−V_Vdiode) for the load feedback current being greater than zero, Wupper being ON, and Vupper being ON, where V_Vdiode is a voltage across a diode of Vlower.

16. The method of claim 15, wherein the control voltage is generated as off for a first time interval (T1) calculated as T1=Tc−TON−TONHALF, the control voltage is on for a second time interval (T2) calculated as T2=Tc−TONHALF−TOFF, the control voltage is on for a third time interval (T3) calculated as T3=Tc−TOFF−TONHALF, and the control voltage is off for a fourth time interval (T4) calculated as T3=Tc−TON−TOFFHALF.

17. The method of claim 11, wherein the load resistance is further calculated as the control voltage divided by the load feedback current.

18. The method of claim 11, wherein the load feedback current is a direct-axis/quadrant-axis magnitude.

19. The method of claim 11, the method further generating the bus voltage for the PWM inverter.

20. A system comprising:
a load;
a pulse generation module that drives a pulse width modulation (PWM) inverter in response to a control voltage, the PWM inverter comprising a U phase pole, a V phase pole, and a W phase pole, wherein each U, V, and W phase pole comprises an upper pole device and a lower pole device, wherein the PWM inverter turns off the U phase pole, turns on the W upper pole device (Wupper), turns off the W lower pole device (Wlower), and applies the control voltage to the V upper pole device (Vupper) and the V lower pole device (Vlower);

a forward drop correction module that corrects the control voltage based on a feedforward compensation voltage determined from a forward voltage drop; and a load resistance module that calculates a load resistance for the load based on an average control voltage, an average bus voltage, and an average load feedback current.

* * * * *